US011073637B2

(12) United States Patent
Dow et al.

(10) Patent No.: US 11,073,637 B2
(45) Date of Patent: Jul. 27, 2021

(54) DATA STRUCTURE FOR FAST INVASION PERCOLATION MODELING SOFTWARE

(71) Applicant: Saudi Arabian Oil Company, Dhahran (SA)

(72) Inventors: Eric A. Dow, Boston, MA (US); Yeqing Fu, Katy, TX (US)

(73) Assignee: Saudi Arabian Oil Company, Dhahran (SA)

( * ) Notice: Subject to any disclaimer, the term of this patent is extended or adjusted under 35 U.S.C. 154(b) by 420 days.

(21) Appl. No.: 16/152,158

(22) Filed: Oct. 4, 2018

(65) Prior Publication Data

US 2020/0110195 A1 Apr. 9, 2020

(51) Int. Cl.
*G01V 99/00* (2009.01)
(52) U.S. Cl.
CPC .................. *G01V 99/005* (2013.01)
(58) Field of Classification Search
CPC .................................................. G01V 99/005
USPC ............................................................ 703/10
See application file for complete search history.

(56) References Cited

U.S. PATENT DOCUMENTS

| 8,073,663 | B2* | 12/2011 | Carruthers | G01V 1/30 703/10 |
| 8,078,439 | B2* | 12/2011 | Srnka | G01V 3/083 703/5 |
| 9,020,793 | B2* | 4/2015 | Kumar | E21B 49/00 703/10 |
| 2009/0037114 | A1* | 2/2009 | Peng | G01V 1/28 702/14 |
| 2010/0223039 | A1* | 9/2010 | Maliassov | G01V 99/00 703/2 |
| 2012/0029895 | A1* | 2/2012 | Xi | G01V 99/005 703/10 |
| 2012/0136636 | A1* | 5/2012 | Kleine | G01V 99/005 703/2 |
| 2013/0064040 | A1* | 3/2013 | Imhof | G01V 1/30 367/73 |

(Continued)

OTHER PUBLICATIONS

Yder Masson (A fast two-step algorithm for invasion percolation with trapping, Computers &Geosciences (2016) 41-48) (Year: 2016).*

(Continued)

*Primary Examiner* — Iftekhar A Khan
(74) *Attorney, Agent, or Firm* — Fish & Richardson P.C.

(57) ABSTRACT

The present disclosure describes methods and systems, including computer-implemented methods, computer program products, and computer systems, for models the accumulation and migration of hydrocarbons. One computer-implemented method includes: identifying one of grid cells neighboring an accumulation as a recent back-filled grid cell; setting an oil phase potential of identified grid cell as an accumulation potential of the accumulation; comparing oil phase potentials of grid cells neighboring the recent back-filled grid cell with the accumulation potential of the accumulation, where the oil phase potential of each of the grid cells neighboring the recent back-filled grid cell is stored as a key in the node corresponding to the respective grid cell; selecting one of the grid cells neighboring the accumulation as a next back-filled grid cell; and updating the accumulation potential of the accumulation based on the oil phase potential of the selected grid cell.

17 Claims, 4 Drawing Sheets

(56) References Cited

U.S. PATENT DOCUMENTS

| | | | | |
|---|---|---|---|---|
| 2013/0158877 | A1* | 6/2013 | Bakke | G01V 1/30 |
| | | | | 702/14 |
| 2013/0218538 | A1* | 8/2013 | Fuecker | G06F 30/23 |
| | | | | 703/2 |
| 2014/0188865 | A1* | 7/2014 | Karatzoglou | G06Q 30/0282 |
| | | | | 707/732 |
| 2014/0233352 | A1* | 8/2014 | Kacewicz | G01V 1/303 |
| | | | | 367/73 |
| 2014/0278298 | A1* | 9/2014 | Maerten | G01V 99/005 |
| | | | | 703/2 |
| 2014/0358502 | A1* | 12/2014 | Kleine | E21B 43/00 |
| | | | | 703/2 |
| 2015/0081265 | A1* | 3/2015 | Kauerauf | G01V 1/40 |
| | | | | 703/10 |
| 2015/0127313 | A1* | 5/2015 | Lawson | G01N 33/241 |
| | | | | 703/10 |
| 2016/0298427 | A1* | 10/2016 | Kauerauf | E21B 43/00 |
| 2016/0363691 | A1* | 12/2016 | Hu | G01V 99/00 |
| 2018/0371875 | A1* | 12/2018 | Kayum | G06F 30/20 |
| 2019/0146119 | A1* | 5/2019 | Vogt | G01V 99/005 |
| | | | | 702/11 |
| 2019/0196059 | A1* | 6/2019 | Ducros | G01V 11/00 |
| 2019/0196060 | A1* | 6/2019 | Ducros | G06F 17/11 |
| 2019/0228121 | A1* | 7/2019 | Fung | G06F 30/20 |
| 2019/0293835 | A1* | 9/2019 | Kauerauf | G01V 99/00 |
| 2019/0302289 | A1* | 10/2019 | Song | G01V 1/282 |
| 2019/0302290 | A1* | 10/2019 | Alwon | G01V 1/364 |
| 2020/0088897 | A1* | 3/2020 | Roy | G01V 1/50 |

OTHER PUBLICATIONS

Hantschel et al. (Fundamentals of Basin and Petroleum Systems Modeling, Springer-Verlag Berlin Heidelberg 2009, pp. 1-473) (Year: 2009).*

Wangen et al. (Simple 3-D Modeling of Hydrocarbon Migration, AAPG/Datapages Discovery Series 2003, p. 243-253) (Year: 2003).*

Bahrami et al. (A Binomial Heap Algorithm for Self-Recognition in Exclusive Management on Autonomic Grid Networks, IEEE, 2010, pp. 326-329) (Year: 2010).*

International Search Report and Written Opinion issued in International Application No. PCT/US2019/053958 dated Jan. 7, 2020, 16 pages.

"Wangen et al., ""Simple 3-D modeling of hydrocarbon migration,"" retrieved from URL <https://www.researchgate.net/profile/Magnus_Wangen/publication/236863846_Simple_3-D_modeling_of_hydrocarbon_migration/links/5464875c0cf2837efdb3be03/Simple-3-D-modeli ng-of-hydrocarbon-mi grati on.pdf?ori gi n=publication_detail>, retrieved Dec. 16, 2019, published Jan. 1, 2003, 11 pages."

Hantschel and Kauerauf, "Fundamentals of basin and petroleum systems modeling: 6.8 Invasion Percolation," Springer Science & Business Media, Apr. 9, 2009, 31 pages.

Masson et al., "A fast algorithm for invasion percolation," Transport in porous media 102.2, Springer Verlag, Feb. 2014, 13 pages.

Masson, "A fast two-step algorithm for invasion percolation with trapping," Computers & Geosciences 90, Part A, May 2016, 9 pages.

GCC Gulf Cooperation Council Examination Report in Appln. No. 2019/38395, dated Aug. 30, 2020, 3 pages.

* cited by examiner

DATA STRUCTURE FOR FAST INVASION PERCOLATION MODELING SOFTWARE

TECHNICAL FIELD

This disclosure relates to a computer software program that models the accumulation and migration of hydrocarbons and, more specifically, to data structures that are used in the computer software programs that implements the modeling.

BACKGROUND

In a geophysics analysis, seismic data are collected and used in analyzing the subsurface geological structure and rock properties of a geographic area. These data, and the analysis based on these data, are instrumental in the exploration, production, and drilling operation of the oil and gas industry. Computer software programs are developed to model the migration of hydrocarbons from source rocks into geologic traps. These computer software programs use the seismic data as input and produce forecasts of the location and size of hydrocarbon accumulations within a sedimentary basin as output. These forecasts can be used to determine the potential for hydrocarbon production in a reservoir and the optimal locations for drilling sites in the reservoir.

SUMMARY

The present disclosure describes methods and systems, including computer-implemented methods, computer program products, and computer systems for determining hydrocarbon accumulations. One computer-implemented method for determining hydrocarbon accumulations in a subsurface structure of a reservoir that includes a plurality of grid cells includes: identifying, by a hardware processor, one of grid cells neighboring an accumulation as a recent back-filled grid cell, where each of the grid cells neighboring the accumulation are represented as a node in a binomial min-heap data structure; setting, by the hardware processor, an oil phase potential of identified grid cell as an accumulation potential of the accumulation; comparing, by the hardware processor, oil phase potentials of grid cells neighboring the recent back-filled grid cell with the accumulation potential of the accumulation, where the oil phase potential of each of the grid cells neighboring the recent back-filled grid cell is stored as a key in the node corresponding to the respective grid cell; selecting, by the hardware processor, one of the grid cells neighboring the accumulation as a next back-filled grid cell; and updating, by the hardware processor, the accumulation potential of the accumulation based on the oil phase potential of the selected grid cell.

Other implementations of this aspect include corresponding computer systems, apparatuses, and computer programs recorded on one or more computer storage devices, each configured to perform the actions of the methods. A system of one or more computers can be configured to perform particular operations or actions by virtue of having software, firmware, hardware, or a combination of software, firmware, or hardware installed on the system that, in operation, cause the system to perform the actions. One or more computer programs can be configured to perform particular operations or actions by virtue of including instructions that, when executed by data processing apparatus, cause the apparatus to perform the actions.

The details of one or more implementations of the subject matter of this specification are set forth in the accompanying drawings and the subsequent description. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

Figure 1:
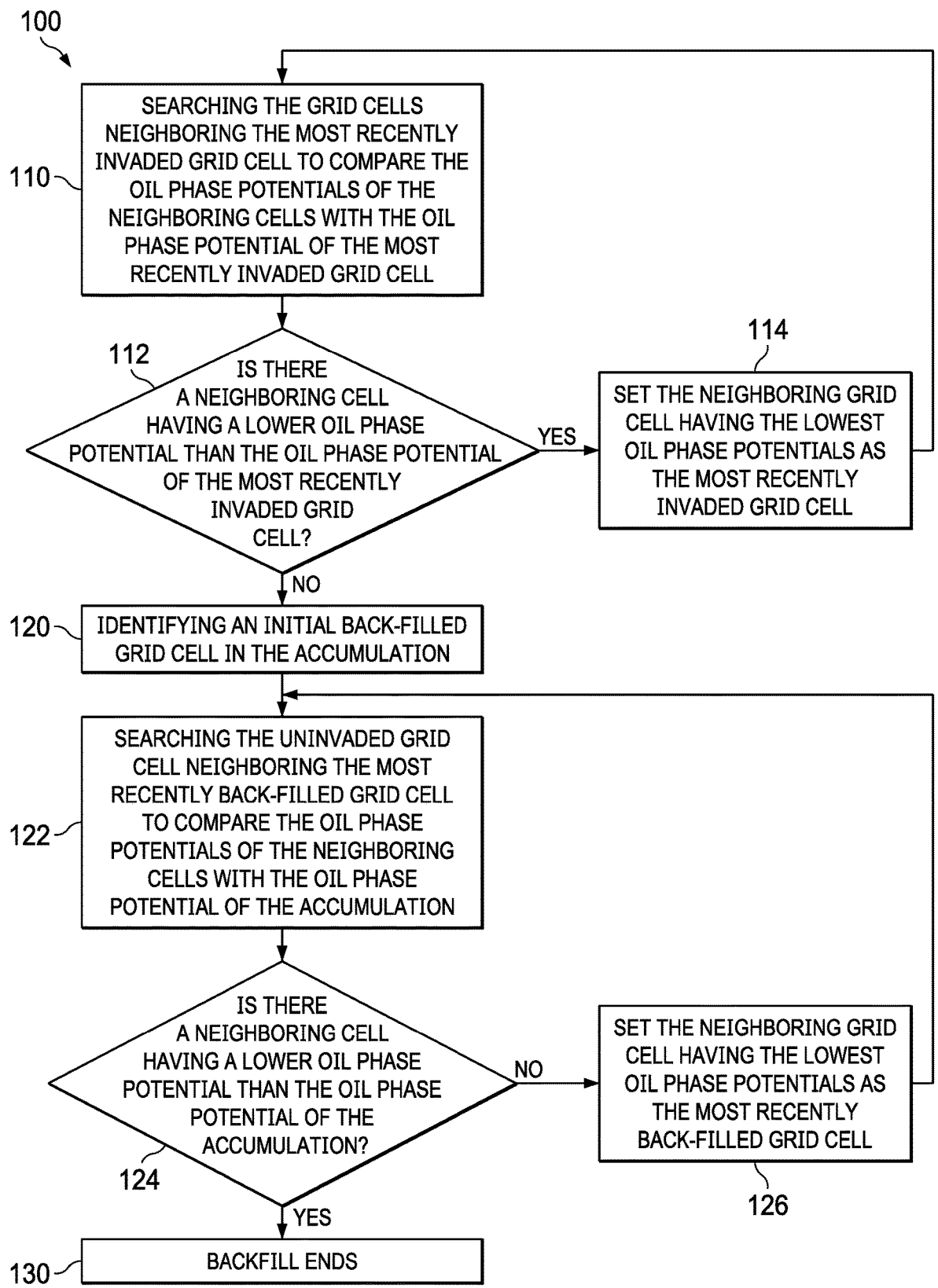
FIG. 1 illustrates an example of a method for hydrocarbon migration modeling, according to an implementation.

The following description is presented to enable any person skilled in the art to make and use the disclosed subject matter, and is provided in the context of one or more particular implementations. Various modifications to the disclosed implementations will be readily apparent to those skilled in the art, and the general principles defined in this disclosure may be applied to other implementations and applications without departing from scope of the disclosure. Thus, the present disclosure is not intended to be limited to the described or illustrated implementations, but is to be accorded the widest scope consistent with the principles and features disclosed in this disclosure.

This disclosure generally describes methods and systems, including computer-implemented methods, computer program products, and computer systems, for fast invasion percolation modeling software. Software modeling of migration of hydrocarbons in a subsurface structure is complicated by the timescales involved (tens to hundreds of millions of years), and the size of the computational grids used to model sedimentary basins (millions to billions of individual grid cells).

To address the challenges of such large spatial and temporal scales involved in hydrocarbon migration modeling, the invasion percolation method can be used as an accelerated migration model. The invasion percolation method uses a sequential algorithm to predict the path of hydrocarbon migration that does not depend on a physical time-step. This approach enables the software program to efficiently generate the path of oil independent of the physical timescales involved.

The invasion percolation method can be used to find the equilibrium distribution of hydrocarbon in a sedimentary basin. The basin is first discretized into a collection of grid blocks, each possessing a value of bulk volume ($v_b$), porosity ($\phi$), depth (z) and capillary threshold pressure ($p_{c,th}$). The oil phase with density $\rho_o$ is migrating through a water phase with density $\rho_w > \rho_o$. The governing equation for the invasion percolation method can be derived based on Darcy's law by taking a limit of the capillary number, as shown in Equation 1. In this equation, the capillary and gravity forces dominate the viscous forces:

$$\nabla p_c = (\rho_w - \rho_o) g \hat{k} \qquad \text{(Equation 1)},$$

where the unit vector $\hat{k}$ points in the direction of gravity, $p_c$ represents the capillary pressure, and g represents the gravity acceleration. The capillary pressure is computed as the difference of the oil pressure $p_o$ and the water pressure $p_w$. Note that equation 1 has no terms involving time, which implies that the invasion percolation method assumes instantaneous migration of the oil phase through the system.

To simulate the migration of the oil phase using the invasion percolation method, water potential $u_w$ and oil potentials $u_o$ can be defined in the following equations, where $p_w$ represents water pressure and $p_c$ represents the capillary pressure between water and oil phase.

$$u_w = p_w - \rho_g gz \quad \text{(Equation 2)},$$

$$u_o = u_w + (\rho_w - \rho_o)gz + p_c \quad \text{(Equation 3)}.$$

In sedimentary basins, the volume of oil is small relative to the volume of water in the system. Thus, the water potential $u_w$ is not affected by the presence of oil. The flow of oil occurs from grid cells with greater oil potential to grid cells with less oil potential. If two locations are at the same potential, there is no flow between those two locations.

The invasion percolation method uses a sequential algorithm to migrate hydrocarbon from a collection of source points, through the sedimentary basin, and into traps. The source points are grid blocks containing mobile hydrocarbon. The migration of hydrocarbon occurs through a series of invasion steps in which hydrocarbon invades neighboring grid cells that were previously filled with water. Which grid cells are invaded is determined by the capillary threshold pressure $p_{c,th}$. The capillary threshold pressure $p_{c,th}$ represents the pressure that is overcome by the oil phase to saturate a rock up to the residual petroleum saturation. When the rock is saturated to the residual oil saturation, the oil phase exits the rock through hydrocarbon pathways. The value of the capillary threshold pressure is computed by evaluating the drainage curve at the critical oil saturation level $S_{o,c}$, in other words, $p_{c,th} = p_c(S_{o,c})$.

For a two-phase invasion percolation process, each grid cell can be in one of three states. The initial state of each grid cell is the uninvaded state, in which case the pore space of a given grid cell is filled with water. Grid cells that have been invaded with hydrocarbon, but are not part of an accumulation, are referred to as pathway grid cells, which are in a pathway state. The saturation of hydrocarbon in these grid cells is the critical saturation level $S_{o,c}$, and the capillary pressure $p_c$ is equal to the capillary threshold pressure $p_{c,th}$. The petroleum in these grid cells exists as immobile petroleum droplets, and there is no pressure communication between these droplets. The third state is the back-filled state, which indicates that this grid cell is part of an oil accumulation. The saturation of hydrocarbon in these grid cells is $1 - S_{wc}$, where $S_{wc}$ is the connate water saturation.

FIG. 1 illustrates an example of a method 100 for hydrocarbon migration modeling, according to an implementation. For clarity of presentation, the description that follows generally describes the method 100 in the context of FIGS. 2-5. However, it will be understood that method 100 may be performed, for example, by any other suitable system, environment, software, and hardware, or a combination of systems, environments, software, and hardware, as appropriate. In some implementations, various steps of method 100 can be run in parallel, in combination, in loops, or in any order.

At 110, the invasion percolation algorithm begins by identifying a grid cell containing hydrocarbon source rock, referred to as a source cell. This grid cell is set to the invaded state. The algorithm proceeds by searching the next invaded grid cell among the grid cell neighboring the most recently invaded grid cell. During the search, the oil phase potentials of each neighboring grid cell are compared with the oil phase potential of the most recently invaded grid cell.

From 110, the method proceeds to 112, where the software program determines whether there is a neighboring cell having a less oil phase potential than the oil phase potential of the most recently invaded grid cell. If there is, the method 100 proceeds from 112 to 114, where the neighboring grid cell having the least oil phase potential is identified as the most recently invaded grid cell. The saturation in the new mostly recently invaded grid cell is taken to be the residual oil saturation $S_{o,c}$. From 114, the method 100 proceeds to 110, where the search continues by searching the neighboring cells of this most recently invaded grid cell.

If none of the neighboring grid cells have an oil phase potential that is less than the oil phase potential of the most recently invaded grid cell, the method 100 proceeds from 112 to 120, where back-filling begins and an accumulation forms. At 120, the most recently invaded grid cell is identified as an initial back-filled grid cell in an accumulation. The oil phase potential of the initial grid cell in the accumulation is set to be the oil phase potential of the accumulation, also referred to as the accumulation potential of the accumulation.

From 120, the method 100 proceeds to 122, where the collection of uninvaded grid cells around the boundary of the accumulation is searched. During the search, the oil phase potentials of each uninvaded grid cell are compared with the accumulation potential of the accumulation.

From 122, the method 100 proceeds to 124, where the software program determines whether there is a neighboring cell having a less oil phase potential than the accumulation potential of the accumulation. If there is not, the method 100 proceeds from 124 to 126, where the neighboring grid cell having the least oil phase potentials is identified as the most recently back-filled grid cell and added to the accumulation. The accumulation potential of the accumulation is updated to be the oil phase potential of the most recently back-filled grid cell. From 126, the method 100 proceeds to 122, where the search continues by searching the uninvaded neighboring cells of this new mostly recently back-filled grid cell.

If there is a neighboring cell having a less oil phase potential than the accumulation potential of the accumulation, the method 100 proceeds from 124 to 130, where the back-filling process ends. Oil flows out of the accumulation through the boundary cell with least oil phase potential, and continues to migrate by searching the neighbors of this cell for the cell with least oil phase potential. The algorithm proceeds until either all of the available oil has been distributed, or the oil leaves the domain through a boundary. The output of the searching algorithm can include predictions of production potential of the basin. The output of the searching algorithm can also include predictions of optimal drilling sites. In some cases, the software program that models the hydrocarbon migration can generate commands for drilling equipment to initiate drilling operations at these drilling sites.

As back-filling proceeds, the set of grid cells neighboring the accumulation shrinks as grid cells are back-filled, but also grows as grid cells neighboring the last back-filled grid cell are added. To efficiently perform the searching process of finding the grid cell with the least value of oil phase potential, a min-heap data structure can be used to maintain the set of neighboring grid cells.

A min-heap is a tree-based data structure that includes a collection of nodes. Each node is associated with a value referred to as the "key." The keys are linked to one another so that they satisfy the following min-heap property: if P is a parent node of C, then the key of P is less than or equal to the key of C. A min-heap can be used to represent a priority queue, where the priority of a node is indicated by the key associated with the node. In the software programs that models the oil migration process discussed previously, the set of uninvaded grid cells neighboring an accumulation are stored in a min-heap. Each node of the min-heap represents an invaded grid cell. The key of each node set to the value of the oil phase potential in the corresponding grid cell.

At each iteration of back-filling, the min-heap node corresponding to the grid cell with least potential is determined. The determined min-heap node is removed from the min-heap and added to the accumulation set. The searching process can be performed in O(log N) operations, where N is the number of grid cells on the boundary of the accumulation. Using a min-heap data structure can reduce the number of operations in the searching process from O(N) to O (log N). The grid cells neighboring the newly back-filled grid cell are examined and inserted to the min-heap if they are not already present. Each insertion takes O(log N) operations.

Using a binary min-heap data structure to represent the set of neighboring grid cells takes into consideration the growth of a single accumulation of hydrocarbon. However, at the scale of a sedimentary basin, multiple accumulations typically grow and merge together. In modeling basin-scale migration, simultaneous growth of multiple accumulations can be coalesced. Two accumulations can coalesce when one accumulation back-fills a grid cell that has been previously back-filled by another accumulation. When two accumulations coalesce, the corresponding min-heaps, including the set of grid cells neighboring the accumulations, are merged. Merging two binary min-heaps may take O(N+M) operations, where N and M are the size of the two min-heaps. Therefore, instead of using a binary min-heap to represent the set of neighboring grid cells, a binomial min-heap data structure can be used. Merging binomial min-heaps would take O(log[N+M]) operations to merge. Thus, instead of scaling linearly, by using a binary min-heap scales, the process of growing and coalescing accumulations can scale logarithmically by using a binomial min-heap. This approach would provide significant savings in computation resources, including memory and processing capabilities, used by the software programs that model the migration and accumulation of the hydrocarbons.

Figure 2:
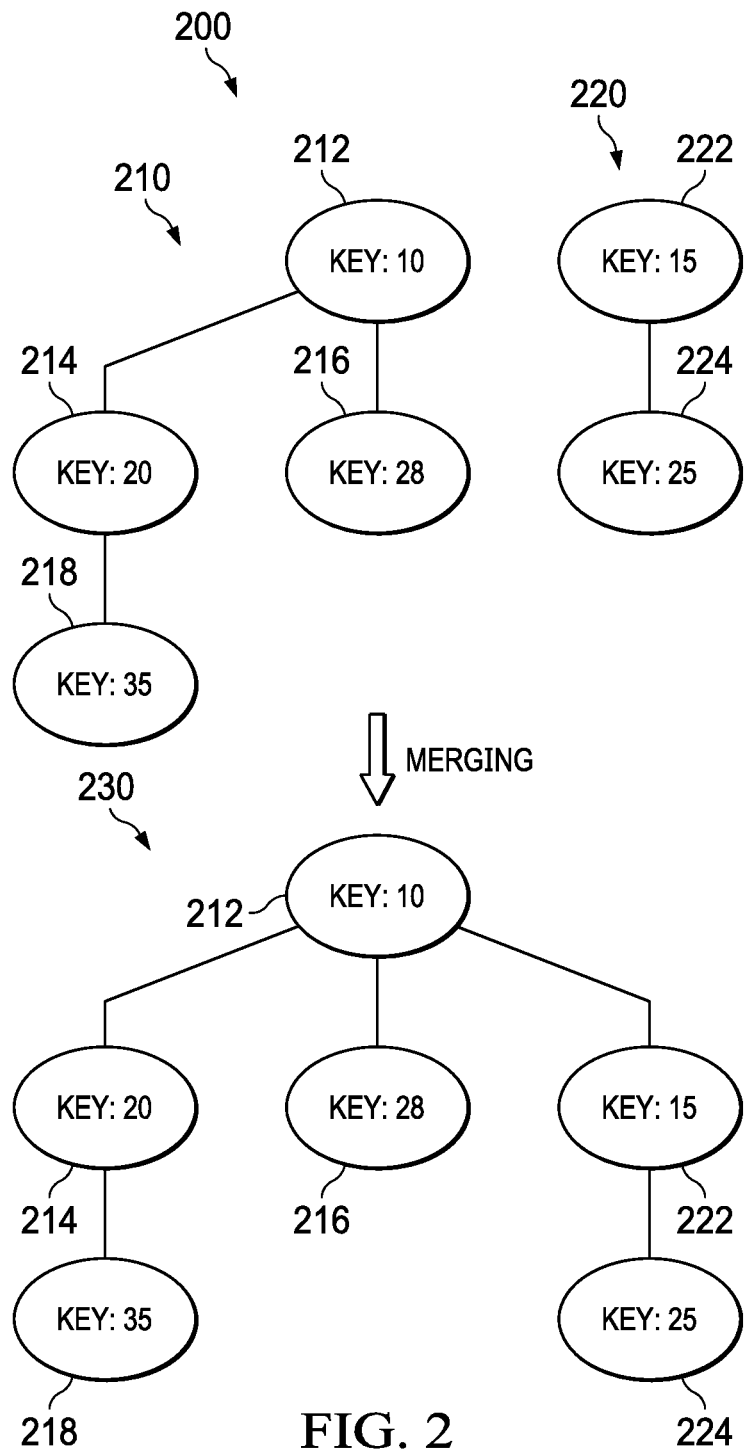
FIG. 2 illustrates a schematic diagram of a merging operation of the grid cells, according to an implementation.

FIG. 2 illustrates a schematic diagram 200 of a merging operation of the grid cells during the searching operation in the back-filling process, according to an implementation. The diagram 200 includes two binomial min-heaps 210 and 220 in a binomial min-heap data structure. A binomial min-heap can also be referred to as a binomial tree. Each binomial min-heap represents a set of grid cells that neighbors an accumulation. Each of the binomial min-heap includes one or more nodes. Each node represents an individual grid cell in the set. For example, as illustrated, the binomial min-heap 210 includes a root node 212, first generation child nodes 214, 216, and a second generation child node 218. The binomial min-heap 220 includes a root node 222 and a first generation child node 224. Each node includes a key field. The value of the key field is set to be the oil phase potential of the grid cell that is represented by the node. As illustrated, each parent node has a key value that is less than the key value of any of its child nodes. While the illustrated binomial min-heap data structure has two binomial min-heaps, the data structure can have more than two binomial min-heaps. Order in a binomial min-heap is defined as the number of generations of child nodes. Note that two binomial min-heaps in the data structure could have different orders. For example, the binomial min-heap 210 has an order of 2, because there are two generations of child nodes: the first generation child nodes 214 and 216, and the second generation child node 218. Correspondingly, the binomial min-heap 220 has an order of 1. As illustrated, the binomial min-heaps 210 and 220 have different numbers of orders.

During a merging operation, the key values of the root nodes of the binomial min-heaps 210 and 220 are compared. The root node 212 has a key value of 10, and the root node 222 has a key value of 15. The root node 212 has a smaller key value. Thus, as illustrated, the root node 212 becomes the new root node of the merged tree 230. The binomial min-heap 220 becomes a subtree of the merged tree 230.

If a grid cell neighbors two accumulations that coalesce, the resulting min-heap of neighbor grid cells can include duplicate entries. These duplicate entries can be identified and removed. In some implementations, a hash table can be used for each min-heap. Each node in the min-heap can include an identity (ID) value. The hash table maps the ID value to a pointer of corresponding min-heap node. The ID value can be an integer. Prior to the merging of the two heaps, their corresponding hash tables are merged. During the merging of the hash tables, the IDs in the hash table of the smaller min-heap is searched. If an ID of a node in the hash table of the smaller min-heap is not found in the hash table of the large min-heap, the ID and its corresponding pointer is inserted into the larger hash table. If an ID of a node in the hash table of the smaller min-heap is found in the hash table of the large min-heap, the ID and its corresponding pointer is not inserted into the larger hash table. Instead, the heap node corresponding to the pointer is removed from the smaller min-heap. This procedure prevents duplicating nodes when the min-heaps are merged. This duplication detection process may take O(N) steps, where N is size of the smaller hash table.

Figure 3:
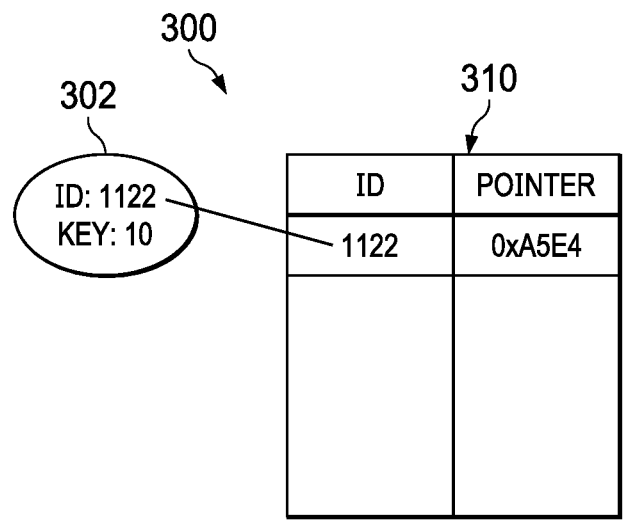
FIG. 3 illustrates a schematic diagram of a hashing table that maps the identity (ID) of a min-heap node with the pointer of the min-heap node, according to an implementation

FIG. 3 illustrates a schematic diagram 300 of a hashing table that maps the identity (ID) of the min-heap node with the pointer of the min-heap node, according to an implementation. The diagram 300 includes a min-heap node 302, which represents a grid cell. The min-heap node 302 has a key value of 10, which represents the oil phase potential of the grid cell. The min-heap node 302 has an ID field. The ID is set to 1122. The diagram 300 also includes a hash table 310 associated with an accumulation. The hash table has a column of IDs and a column of pointers. Each ID corresponds to a pointer. As illustrated, the ID 1122 of the node 302 is stored in the hash table 310. The ID 1122, stored in the hash table 310, corresponds to the pointer 0xA5E4, which is a pointer of the node 302. If the ID 1122 is found to be duplicated in another hash table associated with another accumulation, then the node 302, which is pointed to by the pointer 0xA5E4, will be removed before the min-heaps of the two accumulations are merged.

To compute the value of oil phase potential of a back-filled grid cell, the modeling software keeps track of the accumulation that each grid cell belongs to. The value of the oil phase potential is given by the value in the most recently back-filled grid cell in that accumulation. By tracking which accumulation a grid cell belongs, the software program can add grid cells on the boundary of accumulations to the min-heap, if they are not already part of the accumulation.

To determine which accumulation a grid cell belongs to, an integer array can be used. Each entry in the integer array corresponds to a grid cell. Each entry is initialized with a value of −1 to indicate that no accumulation has visited that grid cell. To identify each accumulation, the integer ID of the grid cell that is first back-filled in the accumulation is used as a label of the accumulation. When additional grid cells are back-filled as part of the accumulation, the entries of the accumulation label corresponding to these grid cells are set to the ID of the accumulation.

Accumulations can coalesce to form larger accumulations, at which point they can be treated as a single, pressure-connected accumulation. Using the accumulation label described previously, the grid cells in the coalesced accumulation would be identified as belonging to two different accumulations if not updated in the process of coalescence. In one implementation, the accumulation label of the grid cells that belonged to one of the original accumulations can be reset to the label of the other accumulation. This operation may take O(N) steps, where N is the number of grid cells in the relabeled accumulation.

Alternatively, an auxiliary data structure can be used to keep track of which accumulations have coalesced, thereby preventing the relabeling operations of coalesced accumulations. To keep track of which accumulations have coalesced, a disjoint set data structure can be used. A disjoint set data structure includes a collection of elements which can be merged together to form sets of elements via a UNION operation. The resulting set is represented using a tree, which includes a representative element at its root. To determine if an element e belongs to a given set S, the FIND operation is used to locate the representative element of the set that e belongs to. If that representative element is equal to the representative element of S, e can be determined to belong to the set S.

To improve the efficiency of the FIND and UNION operations, each element can be assigned a rank. The rank is updated when two sets are merged. When the UNION operation is performed on two elements, the element with the greater rank is chosen to be the root of the resulting tree. Using two optimizations, union-by-rank and path compression, it can be shown that the amortized time per FIND and UNION operation is $O(\alpha(n))$, where a is the inverse Ackerman function, and n is the number of elements in the tree. Since $\alpha(n)$ grows slowly, the amortized time per operation is close to O(1). Therefore, computation time and resources can be greatly reduced.

In some implementations, a collection of disjoint set trees is maintained. Each disjoint tree corresponds to a respective accumulation. The elements of the tree include the accumulation label ID corresponding to the grid cell first back-filled in each accumulation. When two accumulations coalesce, the UNION operation is performed to merge the trees corresponding to the accumulations. To determine which accumulation a grid cell belongs to, the FIND operation is evaluated using the accumulation label corresponding to that grid cell.

Figure 4:
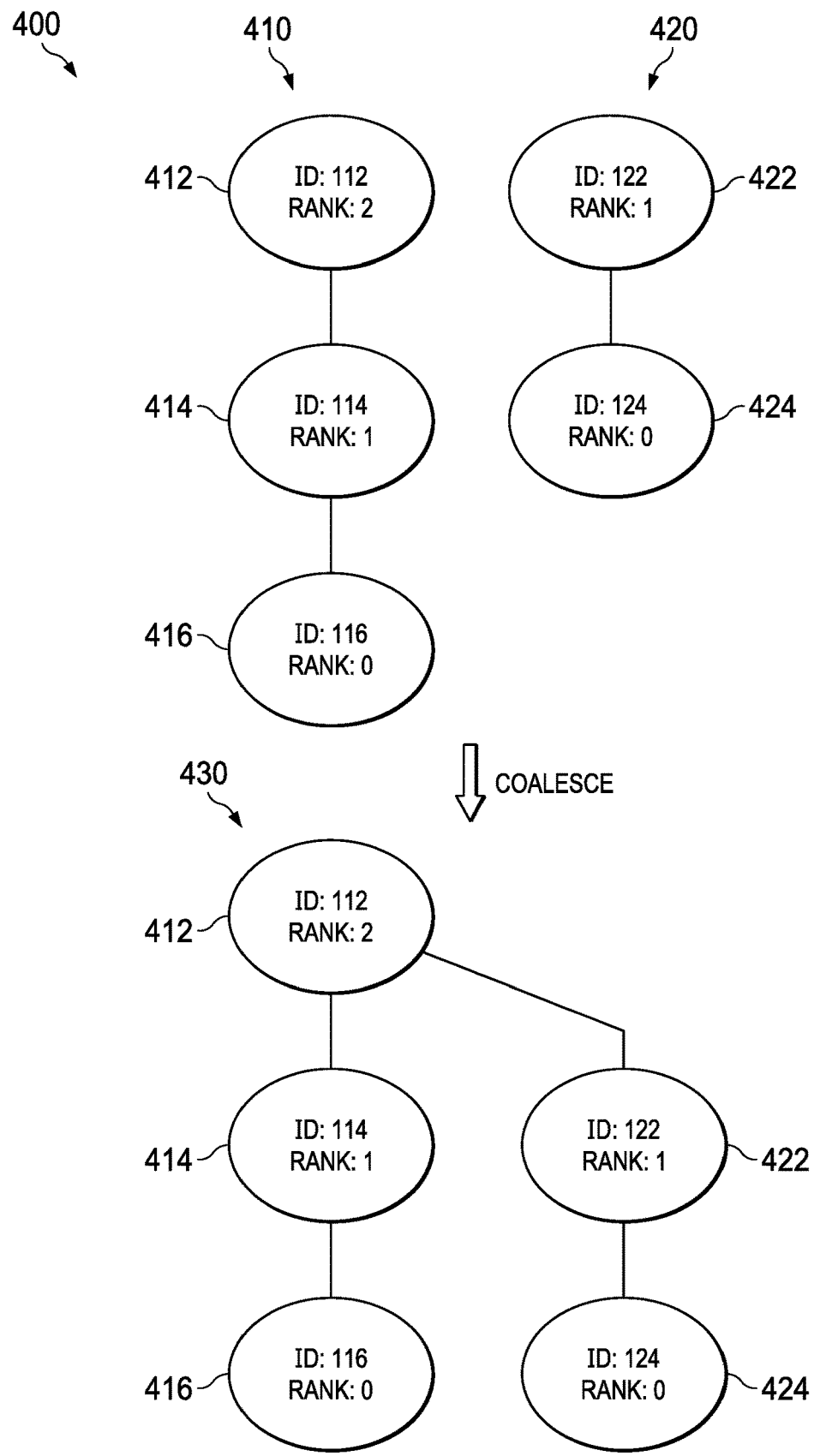
FIG. 4 illustrates a schematic diagram of a coalescing operation of the accumulations, according to an implementation

FIG. 4 illustrates a schematic diagram 400 of a coalescing operation of the accumulation, according to an implementation. The diagram 400 includes two trees 410 and 420, each representing elements of a disjoint set of accumulations. The tree 410 includes a root element 412, and two child elements 414 and 416. This indicates that tree 410 was formed by the coalescing of three smaller accumulations. Each element includes an ID field and a rank field. The ID identifies the grid cell that was first back-filled to form that accumulation. The rank indicates number of generations of child elements that the element has. For example, the element 416 has no child element, and thus its rank is 0. The element 414 has one generation of child elements (element 416), and thus the rank is 1. The root element 412 has two generations of child elements (elements 414 and 416) and thus its rank is 2. Similarly, the tree 420 includes the root element 422 and its child element 424.

When the accumulations associated with the trees 410 and 420 coalesce, a UNION operation is performed. The root element with the greater rank, the root element 412, is selected to be the root element of the resulting tree 430.

In one implementation example, a subsurface domain having two capillary threshold pressure traps was modeled using the software programs implementing the invasion percolation method described previously. One trap is positioned to receive hydrocarbon leaked from the other trap. A single source point of hydrocarbon is placed at the middle of the bottom of the domain. Three different data structures are used to store the neighboring grid cells for the software program to search the accumulation boundaries for the neighbor grid cell with least oil phase potential. The three data structures are array, binary min-heap, and binomial min-heap. Table 1 shows a comparison of the execution times (in units of seconds) by using these different data structures.

TABLE 1

| Grid Size | Array | Binary min-heap | Binomial min-heap |
|---|---|---|---|
| 20 × 20 | 0.31 | 0.40 | 0.34 |
| 50 × 50 | 1.32 | 0.84 | 0.67 |
| 100 × 100 | 8.57 | 2.34 | 1.82 |
| 200 × 200 | 71.17 | 8.99 | 6.41 |
| 500 × 500 | 1082.05 | 62.70 | 39.07 |

As shown in Table 1, for small grid sizes, using an array to store the neighboring cells outperforms the min-heap-based approaches in the searching operation. This effect may be caused by the overhead in storing and updating the min-heap data structures. As the grid size increases, the min-heap-based searching operation outperforms the array-based approach. In addition, the binomial min-heap outperforms the binary min-heap approach.

Figure 5:
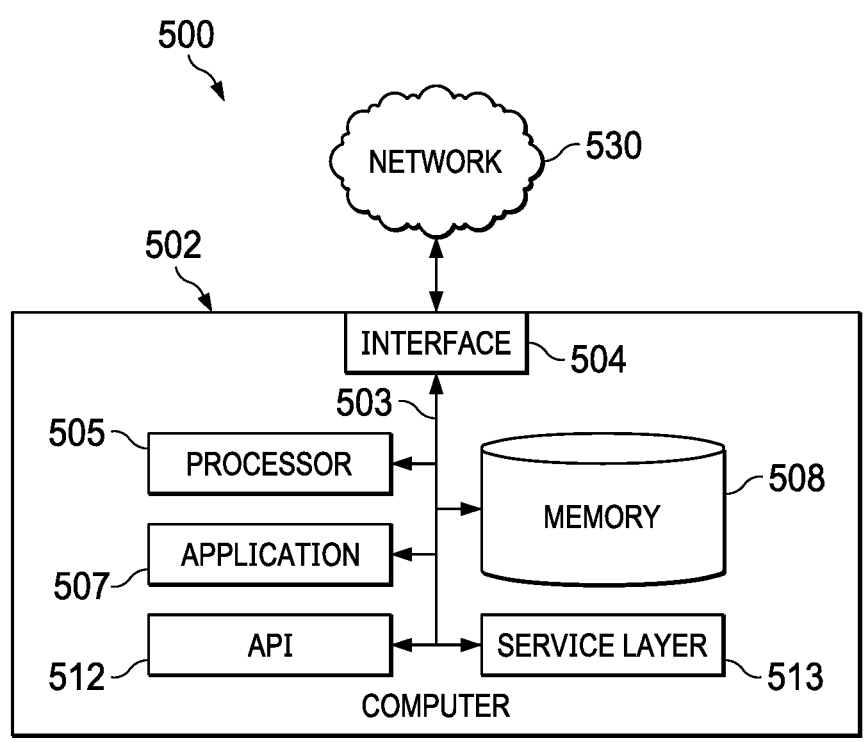
FIG. 5 is a high-level architecture block diagram of hydrocarbon migration modeling system, according to an implementation.

FIG. 5 is a high level architecture block diagram of a hydrocarbon migration modeling system 500 based on the methods described in this disclosure, according to an implementation. At a high level, the illustrated system 500 includes a computer 502 coupled with a network 530.

The described illustration is only one possible implementation of the described subject matter and is not intended to limit the disclosure to the single described implementation. Those of ordinary skill in the art will appreciate the fact that the described components can be connected, combined, or used in alternative ways, consistent with this disclosure.

The network 530 facilitates communication between the computer 502 and other components, for example, components that obtain observed data for a location and transmit the observed data to the computer 502. The network 530 can be a wireless or a wireline network. The network 530 can also be a memory pipe, a hardware connection, or any internal or external communication paths between the components.

The computer 502 includes a computing system configured to perform the method as described in this disclosure. In some cases, the method can be implemented in an executable computing code, for example, C/C++ executable codes. In some cases, the computer 502 can include a standalone LINUX system that runs batch applications. In some cases, the computer 502 can include mobile or personal computers.

The computer 502 may comprise a computer that includes an input device, such as a keypad, keyboard, touch screen, microphone, speech recognition device, other devices that can accept user information, or an output device that conveys information associated with the operation of the computer 502, including digital data, visual or audio information, or a graphic user interface (GUI).

The computer 502 can serve as a client, network component, a server, a database, or other persistency, or any other component of the system 500. In some implementations, one or more components of the computer 502 may be configured to operate within a cloud-computing-based environment.

At a high level, the computer 502 is an electronic computing device operable to receive, transmit, process, store, or manage data and information associated with the system 500. According to some implementations, the computer 502 may also include, or be communicably coupled with, an application server, e-mail server, web server, caching server, streaming data server, business intelligence (BI) server, or other server.

The computer 502 can receive requests over network 530 from a client application (for example, executing on another computer 502) and respond to the received requests by processing said requests in an appropriate software application. In addition, requests may also be sent to the computer 502 from internal users (for example, from a command console), external or third parties, or other automated applications.

Each of the components of the computer 502 can communicate using a system bus 503. In some implementations, any or all the components of the computer 502, both hardware or software, may interface with each other or the interface 504, over the system bus 503, using an application programming interface (API) 512 or a service layer 513. The API 512 may include specifications for routines, data structures, and object classes. The API 512 may be either computer language-independent or -dependent and refer to a complete interface, a single function, or even a set of APIs. The service layer 513 provides software services to the computer 502 or the system 500. The functionality of the computer 502 may be accessible for all service consumers using this service layer. Software services, such as those provided by the service layer 513, provide reusable, defined business functionalities, through a defined interface. For example, the interface may be software written in JAVA, C++, or suitable language providing data in Extensible Markup Language (XML) format. While illustrated as an integrated component of the computer 502, alternative implementations may illustrate the API 512 or the service layer 513 as stand-alone components in relation to other components of the computer 502 or the system 500. Moreover, any or all parts of the API 512 or the service layer 513 may be implemented as sub-modules of another software module, enterprise application, or hardware module, without departing from the scope of this disclosure.

The computer 502 includes an interface 504. Although illustrated as a single interface 504 in FIG. 5, two or more interfaces 504 may be used according to particular needs, desires, or particular implementations of the computer 502 or system 500. The interface 504 is used by the computer 502 for communicating with other systems in a distributed environment—including within the system 500—connected to the network 530 (whether illustrated or not). Generally, the interface 504 comprises logic encoded in software or hardware in a suitable combination and operable to communicate with the network 530. More specifically, the interface 504 may comprise software supporting one or more communication protocols associated with communications such that the network 530 or interface's hardware is operable to communicate physical signals within and outside of the illustrated system 500.

The computer 502 includes a processor 505. Although illustrated as a single processor 505 in FIG. 5, two or more processors may be used according to particular needs, desires, or particular implementations of the computer 502 or the system 500. Generally, the processor 505 executes instructions and manipulates data to perform the operations of the computer 502. Specifically, the processor 505 executes the functionality required for processing geophysical data.

The computer 502 also includes a memory 508 that holds data for the computer 502 or other components of the system 500. Although illustrated as a single memory 508 in FIG. 5, two or more memories may be used according to particular needs, desires, or particular implementations of the computer 502 or the system 500. While memory 508 is illustrated as an integral component of the computer 502, in alternative implementations, memory 508 can be external to the computer 502 or the system 500.

The application 507 is a software engine providing functionality according to particular needs, desires, or particular implementations of the computer 502 or the system 500, particularly with respect to functionality required for processing geophysical data. For example, application 507 can serve as one or more components or applications described in FIGS. 1-4. Further, although illustrated as a single application 507, the application 507 may be implemented as multiple applications 507, on the computer 502. In addition, although illustrated as integral to the computer 502, in alternative implementations, the application 507 can be external to the computer 502 or the system 500.

There may be any number of computers 502 associated with, or external to, the system 500 and communicating over network 530. Further, the terms "client," "user," and other appropriate terminology may be used interchangeably, as appropriate, without departing from the scope of this disclosure. Moreover, this disclosure contemplates that many users may use one computer 502, or that one user may use multiple computers 502.

In some implementations, the described methodology can be configured to send messages, instructions, or other communications to a computer-implemented controller, database, or other computer-implemented system to dynamically initiate control of, control, or cause another computer-implemented system to perform a computer-implemented operation. For example, operations based on data, operations, outputs, or interaction with a GUI can be transmitted to cause operations associated with a computer, database, network, or other computer-based system to perform storage efficiency, data retrieval, or other operations consistent with this disclosure. In another example, interacting with any illustrated GUI can automatically result in one or more instructions transmitted from the GUI to trigger requests for data, storage of data, analysis of data, or other operations consistent with this disclosure.

In some instances, transmitted instructions can result in control, operation, modification, enhancement, or other operations with respect to a tangible, real-world piece of computing or other equipment. For example, the described GUIs can send a request to slow or speed up a computer database magnetic/optical disk drive, activate/deactivate a computing system, cause a network interface device to disable, throttle, or increase data bandwidth allowed across a network connection, or sound an audible/visual alarm (such as, a mechanical alarm/light emitting device) as a notification of a result, behavior, determination, or analysis with respect to a computing system(s) associated with the described methodology or interacting with the computing system(s) associated with the described methodology.

In some implementations, the output of the described methodology can be used to dynamically influence, direct, control, influence, or manage tangible, real-world equipment related to hydrocarbon production, analysis, and recovery or for other purposes consistent with this disclosure. For example, data relating to processed seismic data can be used to enhance quality of produced seismic/structural images or for use in other analytical/predictive processes. As another example, the data relating to processed seismic data can be used to modify a wellbore trajectory, increase/decrease speed of or stop/start a hydrocarbon drill; activate/deactivate an alarm (such as, a visual, auditory, or voice alarm), or to affect refinery or pumping operations (for example, stop, restart, accelerate, or reduce). Other examples can include alerting geo-steering and directional drilling staff when underground obstacles have been detected (such as, with a visual, auditory, or voice alarm). In some implementations, the described methodology can be integrated as part of a dynamic computer-implemented control system to control, influence, or use with any hydrocarbon-related or other tangible, real-world equipment consistent with this disclosure.

Described implementations of the subject matter can include one or more features, alone or in combination.

For example, in a first implementation, a computer-implemented method for determining hydrocarbon accumulations in a subsurface structure of a reservoir, where the subsurface structure includes a plurality of grid cells, comprising: identifying, by a hardware processor, one of grid cells neighboring an accumulation as a recent back-filled grid cell, where each of the grid cells neighboring the accumulation are represented as a node in a binomial min-heap data structure; setting, by the hardware processor, an oil phase potential of identified grid cell as an accumulation potential of the accumulation; comparing, by the hardware processor, oil phase potentials of grid cells neighboring the recent back-filled grid cell with the accumulation potential of the accumulation, where the oil phase potential of each of the grid cells neighboring the recent back-filled grid cell is stored as a key in the node corresponding to the respective grid cell; selecting, by the hardware processor, one of the grid cells neighboring the accumulation as a next back-filled grid cell; and updating, by the hardware processor, the accumulation potential of the accumulation based on the oil phase potential of the selected grid cell.

The foregoing and other implementations can each, optionally, include one or more of the following features, alone or in combination:

A first aspect, combinable with the general implementation, where the selecting one of the grid cells neighboring the accumulation as a next back-filled grid cell comprises: determining, that none of the grid cells neighboring the accumulation has a less oil phase potential than the oil phase potential of the recent back-filled grid cell; and selecting, among the grid cells neighboring the accumulation, a grid cell having a least oil phase potential as the next back-filled grid cell.

A second aspect, combinable with any of the previous or subsequent aspects, where the binomial min-heap data structure includes two binomial trees, each binomial tree representing a respective accumulation, and the method further comprises: merging the two binomial trees.

A third aspect, combinable with any of the previous or subsequent aspects, where the merging comprises: comparing oil phase potentials of root nodes of the two binomial trees; selecting, among the root nodes of the two binomial trees, the root node having a less oil phase potential as a root node of a merged tree; and setting the root node having a greater oil phase potential as a child node in the merged tree A fourth aspect, combinable with any of the previous or subsequent aspects, where the method further comprising: generating a disjoint set that is associated with the accumulation, the disjoint set includes one or more elements, each elements represents an accumulation.

A fifth aspect, combinable with any of the previous or subsequent aspects, where the method further comprising: generating a hash table associated with the accumulation, where the hash table includes a mapping between an identity (ID) of each grid cell associated with the accumulation and a pointer to a node representing the respective grid cell in a binomial min-heap.

A sixth aspect, combinable with any of the previous or subsequent aspects, where the identifying the recent back-filled grid cell comprising comparing the oil phase potentials of the grid cells neighboring the accumulation and identifying the grid cell having the least oil phase potential among the grid cells neighboring the accumulation as the recent back-filled grid cell.

In a second implementation, a non-transitory computer-readable medium storing instructions which, when executed, cause a computer to perform operations comprising: identifying, by a hardware processor, one of grid cells neighboring an accumulation as a recent back-filled grid cell, where the accumulation represents a hydrocarbon accumulation in a subsurface structure of a reservoir, the subsurface structure includes the grid cells, and each of the grid cells neighboring the accumulation are represented as a node in a binomial min-heap data structure; setting, by the hardware processor, an oil phase potential of identified grid cell as an accumulation potential of the accumulation; comparing, by the hardware processor, oil phase potentials of grid cells neighboring the recent back-filled grid cell with the accumulation potential of the accumulation, where the oil phase potential of each of the grid cells neighboring the recent back-filled grid cell is stored as a key in the node corresponding to the respective grid cell; selecting, by the hardware processor, one of the grid cells neighboring the accumulation as a next back-filled grid cell; and updating, by the hardware processor, the accumulation potential of the accumulation based on the oil phase potential of the selected grid cell.

The foregoing and other implementations can each, optionally, include one or more of the following features, alone or in combination:

A first aspect, combinable with the general implementation, where the selecting one of the grid cells neighboring the accumulation as a next back-filled grid cell comprises: determining, that none of the grid cells neighboring the accumulation has a less oil phase potential than the oil phase potential of the recent back-filled grid cell; and selecting, among the grid cells neighboring the accumulation, a grid cell having a least oil phase potential as the next back-filled grid cell.

A second aspect, combinable with any of the previous or subsequent aspects, where the binomial min-heap data structure includes two binomial trees, each binomial tree representing a respective accumulation, and the method further comprises: merging the two binomial trees.

A third aspect, combinable with any of the previous or subsequent aspects, where the merging comprises: comparing oil phase potentials of root nodes of the two binomial trees; selecting, among the root nodes of the two binomial trees, the root node having a less oil phase potential as a root node of a merged tree; and setting the root node having a greater oil phase potential as a child node in the merged tree A fourth aspect, combinable with any of the previous or subsequent aspects, where the operations further comprising: generating a disjoint set that is associated with the accumulation, the disjoint set includes one or more elements, each elements represents an accumulation.

A fifth aspect, combinable with any of the previous or subsequent aspects, where the operations further comprising: generating a hash table associated with the accumulation, where the hash table includes a mapping between an identity (ID) of each grid cell associated with the accumulation and a pointer to a node representing the respective grid cell in a binomial min-heap.

A sixth aspect, combinable with any of the previous or subsequent aspects, where the identifying the recent back-filled grid cell comprising comparing the oil phase potentials of the grid cells neighboring the accumulation and identifying the grid cell having the least oil phase potential among the grid cells neighboring the accumulation as the recent back-filled grid cell.

In a third implementation, a device comprising: at least one hardware processor; and a non-transitory computer-readable storage medium coupled to the at least one hardware processor and storing programming instructions for execution by the at least one hardware processor, where the programming instructions, when executed, cause the at least one hardware processor to perform operations comprising: identifying, by a hardware processor, one of grid cells neighboring an accumulation as a recent back-filled grid cell, where the accumulation represents a hydrocarbon accumulation in a subsurface structure of a reservoir, the subsurface structure includes the grid cells, and each of the grid cells neighboring the accumulation are represented as a node in a binomial min-heap data structure; setting, by the hardware processor, an oil phase potential of identified grid cell as an accumulation potential of the accumulation; comparing, by the hardware processor, oil phase potentials of grid cells neighboring the recent back-filled grid cell with the accumulation potential of the accumulation, where the oil phase potential of each of the grid cells neighboring the recent back-filled grid cell is stored as a key in the node corresponding to the respective grid cell; selecting, by the hardware processor, one of the grid cells neighboring the accumulation as a next back-filled grid cell; and updating, by the hardware processor, the accumulation potential of the accumulation based on the oil phase potential of the selected grid cell.

The foregoing and other implementations can each, optionally, include one or more of the following features, alone or in combination:

A first aspect, combinable with the general implementation, where the selecting one of the grid cells neighboring the accumulation as a next back-filled grid cell includes: determining, that none of the grid cells neighboring the accumulation has a less oil phase potential than the oil phase potential of the recent back-filled grid cell; and selecting, among the grid cells neighboring the accumulation, a grid cell having a least oil phase potential as the next back-filled grid cell.

A second aspect, combinable with any of the previous or subsequent aspects, where the binomial min-heap data structure includes two binomial trees, each binomial tree representing a respective accumulation, and the method further includes: merging the two binomial trees.

A third aspect, combinable with any of the previous or subsequent aspects, where the merging includes: comparing oil phase potentials of root nodes of the two binomial trees; selecting, among the root nodes of the two binomial trees, the root node having a less oil phase potential as a root node of a merged tree; and setting the root node having a greater oil phase potential as a child node in the merged tree A fourth aspect, combinable with any of the previous or subsequent aspects, where the operations further including: generating a disjoint set that is associated with the accumulation, the disjoint set includes one or more elements, each elements represents an accumulation.

A fifth aspect, combinable with any of the previous or subsequent aspects, where the operations further including: generating a hash table associated with the accumulation, where the hash table includes a mapping between an identity (ID) of each grid cell associated with the accumulation and a pointer to a node representing the respective grid cell in a binomial min-heap.

A sixth aspect, combinable with any of the previous or subsequent aspects, where the identifying the recent back-filled grid cell including comparing the oil phase potentials of the grid cells neighboring the accumulation and identifying the grid cell having the least oil phase potential among the grid cells neighboring the accumulation as the recent back-filled grid cell.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory computer-storage medium for execution by, or to control the operation of, data processing apparatus. Alternatively or in addition, the program instructions can be encoded on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of one or more of them.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include, special purpose logic circuitry, for example, a central processing unit (CPU), a FPGA (field programmable gate array), or an ASIC (application-specific integrated circuit). In some implementations, the data processing apparatus or special purpose logic circuitry may be hardware-based or software-based. The apparatus can optionally include code that creates an execution environment for computer programs, for example, code that constitutes processor firmware, a protocol stack, a database management system, an operating system, or a combination of one or more of them. The present disclosure contemplates the use of data processing apparatuses with or without conventional operating systems, for example LINUX, UNIX, WINDOWS, MAC OS, ANDROID, or IOS.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, or libraries. Conversely, the features and functionality of various components can be combined into single components, as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM) or both. The essential elements of a computer are a CPU for performing or executing instructions and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD+/−R, DVD-RAM, and DVD-ROM disks. The memory may store various objects or data, including caches, classes, frameworks, applications, backup data, jobs, web pages, web page templates, database tables, repositories storing business or dynamic information, and any other appropriate information including any parameters, variables, algorithms, instructions, rules, constraints, or references thereto. Additionally, the memory may include any other appropriate data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity or a multi-touch screen using capacitive or electric sensing. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication, for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20, and all or a portion of the Internet. The network may communicate with, for example, Internet Protocol (IP) packets, Frame Relay frames, Asynchronous Transfer Mode (ATM) cells, voice, video, data, or other suitable information between network addresses.

The computing system can include clients and servers. A client and server are generally remote from each other and typically interact through a communication network. The relationship of client and server arises by virtue of computer programs running on the respective computers and having a client-server relationship to each other.

In some implementations, any or all of the components of the computing system, both hardware and software, may interface with each other or the interface using an application programming interface (API) or a service layer. The API may include specifications for routines, data structures, and object classes. The API may be either computer language independent or dependent and refer to a complete interface, a single function, or even a set of APIs. The service layer provides software services to the computing system. The functionality of the various components of the computing system may be accessible for all service consumers via this service layer. Software services provide reusable, defined business functionalities through a defined interface. For example, the interface may be software written in JAVA, C++, or other suitable language providing data in extensible markup language (XML) format or other suitable format. The API or service layer may be an integral or a stand-alone component in relation to other components of the computing system. Moreover, any or all parts of the service layer may be implemented as child or sub-modules of another software module, enterprise application, or hardware module without departing from the scope of this disclosure.

While this specification contains many specific implementation details, these should not be construed as limitations on the scope of any disclosure or on the scope of what may be claimed, but rather as descriptions of features that may be specific to particular implementations of particular disclosures. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described as acting in certain combinations and even initially claimed as such, one or more features from a claimed combination can in some cases be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking and parallel processing may be advantageous.

Moreover, the separation or integration of various system modules and components in the implementations described previously should not be understood as requiring such separation or integration in all implementations, and it should be understood that the described program components and systems can generally be integrated together in a single software product or packaged into multiple software products.

Accordingly, the previous description of example implementations does not define or constrain this disclosure. Other changes, substitutions, and alterations are also possible without departing from the spirit and scope of this disclosure.

What is claimed is:

1. A computer-implemented method for determining hydrocarbon accumulations in a subsurface structure of a reservoir, wherein the subsurface structure includes a plurality of grid cells, comprising:
   identifying, by a hardware processor, one of grid cells neighboring an accumulation as a recent back-filled grid cell, wherein each of the grid cells neighboring the accumulation are represented as a node in a binomial min-heap data structure;
   setting, by the hardware processor, an oil phase potential of identified grid cell as an accumulation potential of the accumulation;
   comparing, by the hardware processor, oil phase potentials of grid cells neighboring the recent back-filled grid cell with the accumulation potential of the accumulation, wherein the oil phase potential of each of the grid cells neighboring the recent back-filled grid cell is stored as a key in the node corresponding to the respective grid cell;
   in response to determining that none of the grid cells neighboring the accumulation has a less oil phase potential than the oil phase potential of the recent back-filled grid cell:
      selecting, among the grid cells neighboring the accumulation, a grid cell having a least oil phase potential as the next back-filled grid cell; and
      updating, by the hardware processor, the accumulation potential of the accumulation based on the oil phase potential of the selected grid cell; and
   continuing back-filling process until a neighboring cell having a less oil phase potential than the accumulation potential of the accumulation is found.

2. The method of claim 1, wherein the binomial min-heap data structure includes two binomial trees, each binomial tree representing a respective accumulation, and the method further comprises: merging the two binomial trees.

3. The method of claim 2, wherein the merging comprises:
   comparing oil phase potentials of root nodes of the two binomial trees;
   selecting, among the root nodes of the two binomial trees, the root node having a less oil phase potential as a root node of a merged tree; and
   setting the root node having a greater oil phase potential as a child node in the merged tree.

4. The method of claim 1, further comprising: generating a disjoint set that is associated with the accumulation, the disjoint set includes one or more elements, each elements represents an accumulation.

5. The method of claim 1, further comprising: generating a hash table associated with the accumulation, wherein the hash table includes a mapping between an identity (ID) of each grid cell associated with the accumulation and a pointer to a node representing the respective grid cell in a binomial min-heap.

6. The method of claim 1, wherein the identifying the recent back-filled grid cell comprising comparing the oil phase potentials of the grid cells neighboring the accumulation and identifying the grid cell having the least oil phase potential among the grid cells neighboring the accumulation as the recent back-filled grid cell.

7. A device, comprising:
  at least one hardware processor; and
  a non-transitory computer-readable storage medium coupled to the at least one hardware processor and storing programming instructions for execution by the at least one hardware processor, wherein the programming instructions, when executed, cause the at least one hardware processor to perform operations comprising:
  identifying, by a hardware processor, one of grid cells neighboring an accumulation as a recent back-filled grid cell, wherein the accumulation represents a hydrocarbon accumulation in a subsurface structure of a reservoir, the subsurface structure includes the grid cells, and each of the grid cells neighboring the accumulation are represented as a node in a binomial min-heap data structure;
  setting, by the hardware processor, an oil phase potential of identified grid cell as an accumulation potential of the accumulation;
  comparing, by the hardware processor, oil phase potentials of grid cells neighboring the recent back-filled grid cell with the accumulation potential of the accumulation, wherein the oil phase potential of each of the grid cells neighboring the recent back-filled grid cell is stored as a key in the node corresponding to the respective grid cell;
  in response to determining that none of the grid cells neighboring the accumulation has a less oil phase potential than the oil phase potential of the recent back-filled grid cell:
    selecting, among the grid cells neighboring the accumulation, a grid cell having a least oil phase potential as the next back-filled grid cell; and
    updating, by the hardware processor, the accumulation potential of the accumulation based on the oil phase potential of the selected grid cell; and
  continuing back-filling process until a neighboring cell having a less oil phase potential than the accumulation potential of the accumulation is found.

8. The device of claim 7, wherein the binomial min-heap data structure includes two binomial trees, each binomial tree representing a respective accumulation, and the operations further comprise: merging the two binomial trees.

9. The device of claim 8, wherein the merging comprises:
  comparing oil phase potentials of root nodes of the two binomial trees;
  selecting, among the root nodes of the two binomial trees, the root node having a less oil phase potential as a root node of a merged tree; and
  setting the root node having a greater oil phase potential as a child node in the merged tree.

10. The device of claim 7, the operations further comprising: generating a disjoint set that is associated with the accumulation, the disjoint set includes one or more elements, each elements represents an accumulation.

11. The device of claim 7, the operations further comprising: generating a hash table associated with the accumulation, wherein the hash table includes a mapping between an identity (ID) of each grid cell associated with the accumulation and a pointer to a node representing the respective grid cell in a binomial min-heap.

12. The device of claim 7, wherein the identifying the recent back-filled grid cell comprising comparing the oil phase potentials of the grid cells neighboring the accumulation and identifying the grid cell having the least oil phase potential among the grid cells neighboring the accumulation as the recent back-filled grid cell.

13. A non-transitory computer-readable medium storing instructions which, when executed, cause a computing device to perform operations comprising:
  identifying, by a hardware processor, one of grid cells neighboring an accumulation as a recent back-filled grid cell, wherein the accumulation represents a hydrocarbon accumulation in a subsurface structure of a reservoir, the subsurface structure includes the grid cells, and each of the grid cells neighboring the accumulation are represented as a node in a binomial min-heap data structure;
  setting, by the hardware processor, an oil phase potential of identified grid cell as an accumulation potential of the accumulation;
  comparing, by the hardware processor, oil phase potentials of grid cells neighboring the recent back-filled grid cell with the accumulation potential of the accumulation, wherein the oil phase potential of each of the grid cells neighboring the recent back-filled grid cell is stored as a key in the node corresponding to the respective grid cell;
  in response to determining that none of the grid cells neighboring the accumulation has a less oil phase potential than the oil phase potential of the recent back-filled grid cell:
    selecting, among the grid cells neighboring the accumulation, a grid cell having a least oil phase potential as the next back-filled grid cell; and
    updating, by the hardware processor, the accumulation potential of the accumulation based on the oil phase potential of the selected grid cell; and
  continuing back-filling process until a neighboring cell having a less oil phase potential than the accumulation potential of the accumulation is found.

14. The non-transitory computer-readable medium of claim 13, wherein the binomial min-heap data structure includes two binomial trees, each binomial tree representing a respective accumulation, and the operations further comprise: merging the two binomial trees.

15. The non-transitory computer-readable medium of claim 14, wherein the merging comprises:
  comparing oil phase potentials of root nodes of the two binomial trees;
  selecting, among the root nodes of the two binomial trees, the root node having a less oil phase potential as a root node of a merged tree; and
  setting the root node having a greater oil phase potential as a child node in the merged tree.

16. The non-transitory computer-readable medium of claim 13, the operations further comprising: generating a disjoint set that is associated with the accumulation, the disjoint set includes one or more elements, each elements represents an accumulation.

17. The non-transitory computer-readable medium of claim 13, the operations further comprising: generating a hash table associated with the accumulation, wherein the hash table includes a mapping between an identity (ID) of each grid cell associated with the accumulation and a pointer to a node representing the respective grid cell in a binomial min-heap.

* * * * *